United States Patent
Baillin et al.

(10) Patent No.: US 9,051,173 B2
(45) Date of Patent: Jun. 9, 2015

(54) TREATMENT METHOD OF A GETTER MATERIAL AND ENCAPSULATION METHOD OF SUCH GETTER MATERIAL

(75) Inventors: Xavier Baillin, Crolles (FR); Emmanuelle Lagoutte, St Marcellin (FR); Guillaume Rodriguez, Le Champ Pres Froges (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 1114 days.

(21) Appl. No.: 12/898,094

(22) Filed: Oct. 5, 2010

(65) Prior Publication Data
US 2011/0079425 A1   Apr. 7, 2011

(30) Foreign Application Priority Data
Oct. 7, 2009   (FR) ..................... 09 56997

(51) Int. Cl.
| | |
|---|---|
| H05K 5/00 | (2006.01) |
| B05D 5/12 | (2006.01) |
| B81C 1/00 | (2006.01) |
| H01J 29/94 | (2006.01) |
| H01L 23/10 | (2006.01) |
| H01L 23/26 | (2006.01) |

(52) U.S. Cl.
CPC ............. *B81C 1/00285* (2013.01); *H01J 29/94* (2013.01); *H01J 2211/52* (2013.01); *H01L 23/10* (2013.01); *H01L 23/26* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 3,408,130 A | | 10/1968 | Fransen et al. |
| 5,583,393 A | * | 12/1996 | Jones ......................... 313/495 |
| 5,964,630 A | * | 10/1999 | Slusarczuk et al. ............ 445/25 |
| 6,051,281 A | * | 4/2000 | Kobayashi et al. ........... 427/535 |
| 6,499,354 B1 | | 12/2002 | Najafi et al. |
| 6,897,551 B2 | | 5/2005 | Amiotti |
| 6,923,625 B2 | | 8/2005 | Sparks |
| 7,595,209 B1 | | 9/2009 | Monadgemi et al. |
| 2003/0138656 A1 | | 7/2003 | Sparks |
| 2006/0063462 A1 | | 3/2006 | Ding et al. |
| 2006/0284545 A1 | * | 12/2006 | Haraguchi .................. 313/496 |

(Continued)

FOREIGN PATENT DOCUMENTS

| | | |
|---|---|---|
| EP | 1 640 333 A1 | 3/2006 |
| FR | 2 883 099 | 9/2006 |

(Continued)

OTHER PUBLICATIONS

U.S. Appl. No. 12/899,077, filed Oct. 6, 2010, Baillin.

(Continued)

*Primary Examiner* — Joseph Miller, Jr.
(74) *Attorney, Agent, or Firm* — Oblon, McClelland, Maier & Neustadt, L.L.P.

(57) ABSTRACT

A treatment method for a getter material is provided, including forming a protective layer on the thin layer getter material by performing at least one oxidation and/or nitriding step of the thin layer getter material conducted under dry atmosphere of dioxygen and/or dinitrogen, wherein the protective layer is composed of oxide and/or nitride of the thin layer getter material, and wherein a thickness of the protective layer is between approximately 1 nm and 10 nm.

14 Claims, 2 Drawing Sheets

(56) References Cited

U.S. PATENT DOCUMENTS

Figure 1:
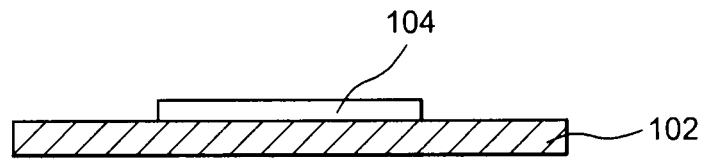

| | | |
|---|---|---|
| 2008/0213539 A1 | 9/2008 | Souriau et al. |
| 2009/0215610 A1 | 8/2009 | Kullberg et al. |
| 2010/0193215 A1 | 8/2010 | Baillin |
| 2012/0112334 A1 | 5/2012 | Baillin et al. |
| 2013/0221497 A1 | 8/2013 | Baillin |

FOREIGN PATENT DOCUMENTS

| | | |
|---|---|---|
| FR | 2 922 202 | 4/2009 |
| JP | 2002-75170 A | 3/2002 |
| JP | 2004-31276 A | 1/2004 |
| JP | 2006-521688 A | 9/2006 |
| JP | 2007-537040 A | 12/2007 |
| JP | 2008-84987 A | 4/2008 |
| WO | WO 01/54178 A1 | 7/2001 |
| WO | WO 01/91210 A1 | 11/2001 |
| WO | WO 2004/094298 A2 | 11/2004 |
| WO | WO 2005/113376 A1 | 12/2005 |
| WO | WO 2006/089068 A2 | 8/2006 |
| WO | WO 2009/087284 A1 | 7/2009 |

OTHER PUBLICATIONS

Search Report issued May 27, 2010 in France Application No. 0956997 (With English Translation of Category of Cited Documents).

H. Henmi, et al. "Vacuum packaging for microsensors by glass-silicon anodic bonding", Sensors and Actuators A, vol. A43, No. 1/03, XP-000454118, May 1, 1994, pp. 243-248.

Office Action issued Feb. 3, 2014 in Japanese Patent Application No. 2010-226463 (with English language translation).

* cited by examiner

TREATMENT METHOD OF A GETTER MATERIAL AND ENCAPSULATION METHOD OF SUCH GETTER MATERIAL

CROSS-REFERENCE TO RELATED APPLICATION

This application claims the benefit of priority under 35 U.S.C. §119 from prior French Patent Application No. 09 56997, filed on Oct. 7, 2009, the entire content of which is incorporated herein by reference.

TECHNICAL FIELD

The invention relates to the field of getter materials used to produce gaseous absorption and/or adsorption, for example in a closed cavity encapsulating a microelectronic and/or nanoelectronic device. The invention relates more particularly to carrying out protective treatment of such getter materials.

PRIOR ART

When encapsulation of a microelectronic and/or nanoelectronic device for example of MEMS (electromechanical microsystem) and/or NEMS (electromechanical nanosystem) and/or MOEMS (opto-electromechanical microsystem) and/or NOEMS (opto-electromechanical nanosystem) type is carried out in a hermetically sealed cavity, it is known to deposit a getter material in a thin layer inside the cavity, either to the side of the device or against the cover of the cavity, as described in documents U.S. Pat. No. 6,897,551 B2 and WO 2009/087284 A1. Getter material is a material comprising, intrinsically and/or via its microscopic or nanoscopic morphology, absorbent and/or adsorbent properties vis-à-vis gaseous molecules, capable of forming a chemical gas pump when it is placed in a closed environment. Such getter material therefore controls the pressure in a cavity encapsulating a microelectronic and/or nanoelectronic device. Non-evaporable getter materials are for example metals such as titanium, zirconium, vanadium, or even metal alloys of these metals or other adapted metals.

The drawback to getter made in a thin layer is having strong reactivity with ambient air. So, if a getter material in a thin layer is exposed to ambient air after it is made, the getter material then absorbs gases from the ambient air (oxygen, nitrogen, carbon monoxide and dioxide) as well as water vapour present in the ambient air. For instance, if the getter material is composed of titanium, the chemical reaction of the getter material with the water vapour is:

$$\text{Ti(solid)} + \text{H}_2\text{O(gas)} \rightarrow \text{TiO}_x + y\text{H} \qquad (1)$$

Such exposure of the getter material to ambient air forms a layer of oxide of a few nanometers in thickness on the surface of the layer of getter material. Also, hydrogen molecules dissolve in the getter material. The same reaction is obtained when the getter material is composed of zirconium or any other getter material. The presence of hydrogen in the getter material poses a problem since this hydrogen is released by getter material via desorption phenomenon when subjected to a temperature close to its activation temperature and under secondary vacuum, that is, at pressure between approximately $10^{-3}$ mbar and $10^{-7}$ mbar, these conditions frequently arising during encapsulation of the device and/or during thermal activation of the getter material. It is possible for such degassing to be consecutive and/or simultaneous to dissolution of the oxide in the getter material during its activation. But such degassing of hydrogen appearing after closing of the cavity encapsulating the device can be damaging to the operation of the device. Also, formation of the oxide in the getter material by exposure to ambient air is poorly controlled since it depends inter alia on the partial pressure of water vapour in the ambient atmosphere which is random.

When the getter material has been exposed to ambient air, degassing of the getter material can be carried out prior to its encapsulation with the device to eliminate gaseous particles contaminating the getter material. But such degassing can be obtained only by thermal treatment of the getter material over several hours, which represents a disadvantage for completing the encapsulation method.

The document U.S. Pat. No. 6,923,625 B2 describes a solution for protecting the getter material from contamination by ambient air, such as oxidation of getter material, by depositing a thin layer composed of noble metal against the getter material. This solution requires both making an additional deposit which, in addition to the extra costs generated, needs substantial control over the thickness of the protective layer of the noble metal, and also can add difficulties for forming the getter by photolithography and etching, or even may pose compatibility problems with technological stacking undertaken to construct the encapsulated micro-device.

EXPLANATION OF THE INVENTION

Thus there is a need to propose a method for effectively protecting a getter material, for example intended to be encapsulated in a cavity in which a microelectronic and/or nanoelectronic device may also be encapsulated, vis-à-vis ambient air and in particular vis-à-vis water vapour present in the ambient air, but also for protecting this getter material from any chemical alteration which might be caused by external gases.

For this, a treatment method of a getter material is proposed, comprising at least one oxidation and/or nitriding step of the getter material conducted under dry atmosphere of dioxygen and/or dinitrogen, forming a protective layer composed of oxide and/or nitride of the getter material.

"Dry atmosphere of dioxygen and/or dinitrogen" means atmosphere under low or zero partial pressure of water vapour (for example less than approximately $10^{-5}$ mbar).

Such a treatment method therefore forms a protective layer composed of oxide and/or nitride able to reversibly absorb and/or adsorb gaseous molecules, for example those of ambient air, protecting the entire surface of the getter material from any alteration by these gaseous molecules. The molecules absorbed and/or adsorbed by the protective layer composed of oxide and/or nitride could be desorbed by subsequent execution of simple degassing. Such a treatment method is therefore responsible for consequently exposing the getter material to ambient air without it being altered by gases in ambient air, which eliminates the technological constraint consisting of linking and carrying out the encapsulation of the getter material just after making the getter material to avoid exposure of the getter material to ambient air.

Relative to oxidation of the getter material produced by exposing a getter material to ambient air, oxidation and/or nitriding conducted dry, that is, carried out in a closed environment comprising dry oxygen and/or dry dinitrogen, do not diffuse hydrogen molecules in the getter material. Therefore, no degassing to specifically eliminate these hydrogen molecules is necessary prior to encapsulating the getter material.

Such a treatment method also boosts the pumping capacity of the getter material relative to unprotected getter material exposed to ambient air.

Finally, the getter material protected in this way can be activated thermally from a lower activation temperature, for example less than approximately 20° C. to 30° C., than the activation temperature of unprotected getter material exposed to ambient air.

Advantageously, to obtain this low or zero partial pressure of water vapour, the method may comprise a step for vacuuming or keeping under vacuum the environment containing the getter material, prior to the oxidation and/or nitriding step. Therefore, the oxidation and/or nitriding step may be conducted in a vacuum environment.

The oxidation step may be conducted at pressure greater than approximately $10^{-2}$ mbar and/or at a temperature between approximately 50° C. and 120° C. and/or over a period between approximately 1 minute and 10 minutes, especially when the getter material is composed of titanium and/or zirconium. These parameters correspond to the fact that the kinetics of oxidation of titanium in this temperature range remains the same. Also, the surface may appear saturated with species adsorbed from approximately $10^{-2}$ mbar over an exposure period close to a minute. Therefore, selecting a temperature between approximately 50° C. and 120° C., and advantageously 100° C., forms a protective layer sufficiently thick to absorb and/or adsorb the gaseous molecules to which the getter material is exposed, and sufficiently fine for the latter not to form a barrier with getter effect, nor contributes to increasing the thermal activation temperature of the getter material and limiting its absorption and/or adsorption capacity. The resulting protective layer may have a thickness of between approximately one and a few nanometers, for example less than approximately 10 nm.

The nitriding step may be conducted according to the parameters indicated hereinabove, and preferably at a temperature between approximately 100° C. and 120° C., and/or over a period between approximately 1 mn and 10 mn and/or at pressure greater than approximately $10^{-2}$ mbar, especially when the getter material is composed of titanium and/or zirconium.

The parameters indicated hereinabove may also apply for getter materials other than titanium or zirconium.

The method may further comprise, when the getter material is exposed to ambient air prior to execution of the oxidation and/or nitriding step, thermal treatment step of the getter material at a temperature close to its activation temperature, and for example equal to approximately its activation temperature, and under secondary vacuum conducted prior to the oxidation and/or nitriding step of the getter material. Such thermal treatment desorbs and/or dissolves the gaseous species adsorbed and/or transformed into oxide and/or nitride by a getter material not having yet undergone the treatment method forming the protective layer composed of oxide and/or nitride. In this case, the thermal treatment step may be conducted over a period of between approximately 1 hour and 10 hours.

The treatment method may be carried out for all types of getter materials. The getter material may especially be made as a thin layer and/or be composed of titanium and/or zirconium and/or vanadium.

Getter material may have a grain size of less than or equal to approximately 200 nm.

It is also proposed an encapsulation method of a getter material in a cavity, comprising at least the steps of:

depositing at least the getter material on a face of a layer intended to form a wall of the cavity;

conducting a treatment method of the getter material such as described hereinabove;

closing of the cavity containing the getter material.

The cavity may be obtained either by transfer of a cover to a substrate, or by deposit on the substrate of a sacrificial layer then a cover layer (or closing layer) then by elimination of the sacrificial layer. In this second variant, the closing step may consist of closing release holes for eliminating the sacrificial layer formed in the layer cover. In this case, the protective layer of the getter material protects not only the getter from humidity, but also protects the getter from steps for making and releasing the sacrificial layer.

The method may further comprise, between the treatment method of the getter material and the closing step of the cavity, carrying out a thermal treatment step of the getter material at a temperature less than approximately 50° C. to 150° C. relative to the activation temperature of the getter material and under secondary vacuum. Such thermal treatment especially desorbs the gaseous molecules which have been adsorbed and/or absorbed by the protective layer when the getter material was exposed to ambient air after the protective layer was made, at the same time avoiding activating the getter material during this degassing phase.

The thermal treatment step of the getter material carried out between the treatment method of the getter material and the closing step of the cavity may be conducted over a period between approximately a few minutes and a few tens of minutes, for example between approximately 2 min and 50 min.

The method may further comprise a thermal activation step of the getter material, after execution of the treatment method of the getter material or, when the method comprises a thermal treatment step of the getter material conducted between the treatment method of the getter material and the closing step of the cavity, after said thermal treatment step of the getter material. Apart from thermal activation as such of the getter material, this step also allows the getter material to absorb the oxygen and/or nitrogen molecules forming the oxide and/or nitride particles of the protective layer, producing uniform getter material, and therefore eliminating the protective layer. Also, this thermal activation step of the getter material may be conducted during the closing step of the cavity.

Thermal activation of the getter material may be completed by heating the getter material to a temperature between approximately 200° C. and 450° C.

A microelectronic and/or nanoelectronic device may also be encapsulated in the cavity.

Getter material is also proposed, comprising at least on the surface one protective layer composed of at least one non-native oxide and/or nitride of the getter material. The term "non-native oxide" designates oxide not formed naturally in ambient air, but which is for example formed by an oxidation step under dry atmosphere of dioxygen and/or dinitrogen such as described previously.

The protective layer may have a thickness of between approximately 1 nm and 10 nm.

Said getter material may be made in a thin layer and/or be composed of titanium and/or zirconium and/or vanadium.

It is also proposed an encapsulation structure comprising at least one cavity containing a getter material such as described hereinabove.

The encapsulation structure may further comprise at least one microelectronic and/or nanoelectronic device encapsulated in the cavity.

BRIEF DESCRIPTION OF THE DIAGRAMS

Figure 2:
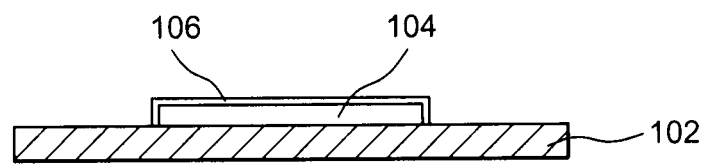
Figure 3:
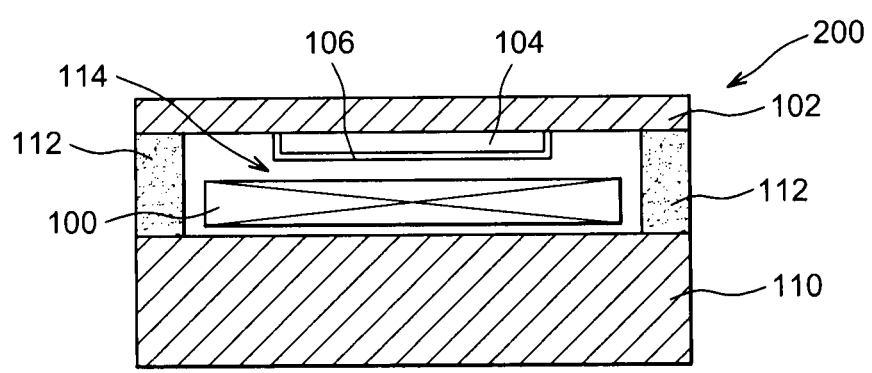
Figure 4:
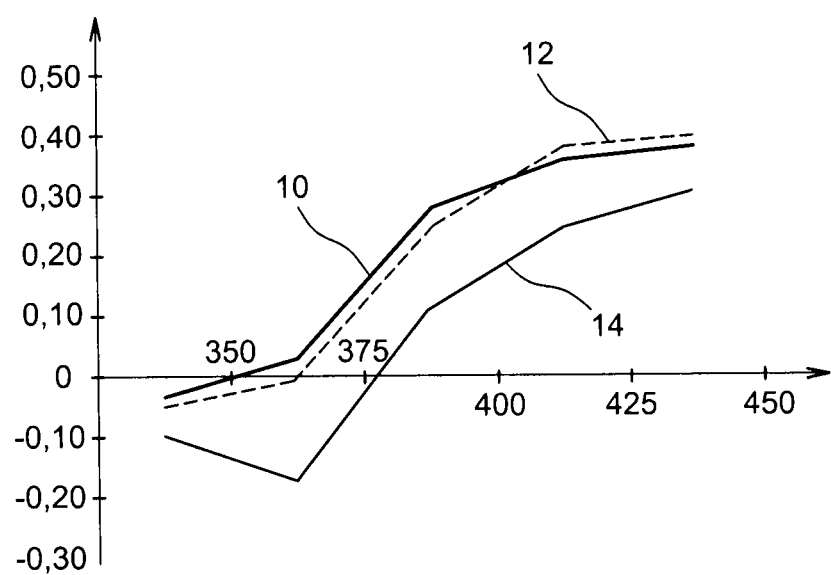

The present invention will be better understood from the description of embodiments given purely by way of indication and non-limiting, with reference to the attached diagrams, in which:

FIGS. 1 to 3 illustrate the steps of an encapsulation method of a getter material according to a particular embodiment, FIG. 4 illustrates the pumping capacities of nitrogen of different getter materials protected or not by an oxidation or nitriding layer as a function of the thermal activation temperature of getter materials.

Identical, similar or equivalent parts of the different figures described hereinafter bear the same reference numerals for easy reference to all figures.

The different parts shown in the figures are not necessarily shown according to a uniform scale, to make the figures more legible.

The different possibilities (variants and embodiments) must be understood as not being exclusive to each other and can be combined.

DETAILED EXPLANATION OF PARTICULAR EMBODIMENTS

Reference is made to FIGS. 1 to 3 which illustrate the steps of an encapsulation method of a getter material 104 and of a microelectronic and/or nanoelectronic device 100, for example of MEMS and/or NEMS and/or MOEMS and/or NOEMS type, according to a particular embodiment.

As shown in FIG. 1, the getter material 104 is deposited on a substrate 102 intended to form the cover of a cavity in which the getter material 104 and the device 100 are intended to be encapsulated. The getter material 104, here titanium, is for example made by lift-off deposit (deposit through a sacrificial mask made on the substrate 102) or by deposit through a stencil, in the form of a thin layer, that is, whereof the thickness is less than or equal to approximately 10 µm. The getter material 104 may also be formed by lithography and etching.

Treatment of the getter material 104 is then carried out so that it is protected especially from ambient air. For this, dry dioxygen ($O_2$) and/or dry dinitrogen ($N_2$) are injected into the deposit chamber at a temperature between approximately 50° C. and 120° C., and for example equal to approximately 100° C., the pressure prevailing in the deposit chamber being for example at a minimum equal to approximately $10^{-2}$ mbar. Placing the getter material 104 in the presence of dioxygen and/or dinitrogen over a period of a few minutes, for example between approximately 1 mn and 10 mn, executes dry oxidation and/or nitriding of the getter material 104, forming a protective layer 106 composed of titanium oxide and/or titanium nitride on the surface of the getter material 104, as is shown in FIG. 2. The thickness of the protective layer 106 is for example between approximately 1 nm and a few nanometers, and for example less than approximately 10 µm. The oxidation and nitriding reactions of titanium correspond to the following equations:

$$Ti(solid)+O_2(gas)\rightarrow Ti_xO_y(solid) \qquad (2)$$

$$Ti(solid)+N_2(gas)\rightarrow Ti_wN_z(solid) \qquad (3)$$

The indices x, y, w and z represent the possibility of having non-stœchiometric compounds, relative to the expected compounds, specifically $TiO_2$ and TiN. In the event of subsequent exposure of the getter material 104 to ambient air, the resulting protective layer 106 protects it from chemical alterations able to be caused by gases present especially in ambient air, as these gases are then absorbed and/or adsorbed by the protective layer 106 without polluting the getter material 104, but also by the chemical products used in photolithography. It is therefore possible to store the substrate 102 and the getter material 104 in ambient air prior to using the substrate 102 to form the cavity in which the device 100 and the getter material 104 are intended to be encapsulated.

As shown in FIG. 3, the substrate 102 is assembled with a second substrate 110 in which the device 100 is made, forming an encapsulation structure 200. This assembly is done by connecting the substrate 102 to the second substrate 110 by means of a sealing bead 112, forming a hermetic cavity 114 encapsulating the device 100 and the getter material 104. Throughout this assembly, thermal treatment under secondary vacuum is conducted to desorb the gases adsorbed and/or absorbed by the protective layer 106 when it was exposed to ambient air, for example carried out at a temperature of less than approximately 50° C. to 150° C. relative to the activation temperature of the getter material over a period between approximately a few minutes and a few tens of minutes. Therefore, these gases are evacuated prior to the cavity 114 being hermetically sealed.

Encapsulation is then achieved by conducting thermal activation of the getter material 104 by means of annealing the getter material 104 at a temperature for example between approximately 200° C. and 450° C. and selected as a function of the nature of getter material. Apart from thermal activation of the getter material 104, this annealing also "dissolves" the protective layer 106, that is, eliminates the protective layer 106, with the oxygen and/or nitrogen molecules present in the protective layer 106 in the form of oxide and/or nitride particles then being absorbed by all the getter material 104, producing uniform getter material 104, here composed of titanium.

In the example described hereinabove in conjunction with FIGS. 1 to 3, the getter material 104 is formed directly when deposited onto the substrate 102, then oxidised and/or nitrided by dry dioxide and/or dry dinitrogen. In a variant, it is possible for the getter material to first be deposited in the form of a thin layer completely covering the substrate 102. The getter material 104 is then oxidised and/or nitrided by dry dioxide and/or dry dinitrogen, forming the protective layer 106, then formed by photolithography and either dry, reactively or not, or humid etching. The oxide and/or nitride layer 106 formed does not modify the behaviour of the getter material 104 vis-à-vis the completed etching.

In the method previously described, formation of the protective layer 106 composed of oxide and/or nitride is done in-situ in the deposit chamber of the getter material 104. But the method for forming the protective layer 106 may also apply to getter materials having previously been exposed to ambient air. In this case, thermal treatment in an enclosure under secondary vacuum at a temperature for example equal to approximately 350° C. for several hours is conducted prior to formation of the protective layer 106. On completion of this thermal treatment, dry oxidation and/or nitriding such as described previously for forming the protective layer 106 are then carried out by keeping the getter material in the enclosure under vacuum so as not to expose again the getter material to ambient air. During making of the protective layer 106, the vacuum formed in the enclosure is adjusted to a pressure greater than approximately $10^{-2}$ mbar and the temperature is adjusted to be between approximately 50° C. and 120° C., and preferably equal to approximately 100° C.

Making the protective layer 106 composed of oxide and/or nitride also boosts the pumping capacity of the getter material. The curve 10 traced on FIG. 4 represents the pumping capacity (in mbar·cm³/cm²) of the getter material 104 as a function of the thermal activation temperature (in ° C.) of the getter material 104, when the protective layer 106 is composed of titanium oxide (that is, formed by dry oxidation of the getter material 104). The curve 12 represents the pumping capacity of this same getter material 104, but with a protective layer 106 composed of titanium nitride (that is, formed by dry nitriding of the getter material 104). Finally, the curve 14 represents the pumping capacity of this same getter material 104, but having no protective layer.

FIG. 4 clearly shows that the presence of a protective layer composed of oxide or nitride boosts the pumping capacity of the getter material relative to a same getter material not having a protective layer and which has been exposed to ambient air. Also, it is evident on the curve 14 that between 350° C. and 375° C., that is, prior to the end of the thermal activation of the getter material not having a protective layer, the unprotected getter material carries out degassing (which translates in FIG. 4 by a drop in pumping capacity), constituting a major disadvantage, since such degassing appearing during thermal activation of the getter material, that is, after the closing of the cavity in which the getter material and the device are encapsulated, increases pressure prevailing in the cavity, which may perturb operating of the device. Comparatively, it is evident on curves 10 and 12 that such degassing does not occur when the getter material is protected by a protective layer composed of oxide or nitride (no drop in the pumping capacity apparent on curves 10 and 12 during thermal activation of the getter material).

The encapsulation method described hereinabove during which a protective layer is formed by dry oxidation and/or nitriding of the getter material applies particularly for making microsystems or nanosystems of MEMS, NEMS, MOEMS, NOEMS types or infrared detectors needing a controlled atmosphere. Also, even though encapsulation of the getter material 104 and of the device 100 described hereinabove is done by assembling two substrates, this encapsulation of the device 100 and of the getter material 104 in a hermetic cavity could be done by depositing, as a thin layer, the cover of the cavity on the substrate 110 (getter material 104 being in this case formed to the side of the device 100).

In a variant, it is possible for the getter material not to be deposited on the substrate 102 but on the second substrate 110, for example placed to the side of the device 100.

The invention claimed is:

1. A treatment method for a thin layer getter material, comprising:
    forming a protective layer on the thin layer getter material by performing at least one oxidation and/or nitriding step of the thin layer getter material conducted under dry atmosphere of dioxygen and/or dinitrogen,
    wherein the protective layer is composed of oxide and/or nitride of the thin layer getter material,
    wherein the protective layer is substantially planar,
    wherein a thickness of the protective layer is between approximately 1 nm and 10 nm, and
    wherein the protective layer and the thin layer getter material are disposed in a cavity, the cavity being sealed such that at least a portion of the cavity remains.

2. The method according to claim 1, further comprising, prior to the oxidation and/or nitriding step, a step for setting to a vacuum or keeping under vacuum of the environment containing the thin layer getter material.

3. The method according to claim 1, further comprising, when the thin layer getter material is exposed to ambient air prior to carrying out the oxidation and/or nitriding step, a thermal treatment step of the thin layer getter material at a temperature close to its thermal activation temperature and at a pressure between $10^{-3}$ mbar and $10^{-7}$ mbar prior to the oxidation and/or nitriding step of the thin layer getter material.

4. The method according to claim 3, in which the thermal treatment step is carried out over a period between approximately 1 hour and 10 hours.

5. The method according to claim 1, in which the thin layer getter material is composed of titanium and/or zirconium and/or vanadium.

6. The method according to claim 1, in which the thin layer getter material comprises a grain size of less than or equal to approximately 200 nm.

7. An encapsulation method of a thin layer getter material in a cavity, comprising:
    depositing the thin layer getter material on at least one face of a layer intended to form a wall of the cavity;
    forming a protective layer on the thin layer getter material by conducting a treatment method of the thin layer getter material, comprising:
        performing at least one oxidation and/or nitriding step of the thin layer getter material conducted under dry atmosphere of dioxygen and/or dinitrogen,
        wherein the protective layer is composed of oxide and/or nitride of the thin layer getter material,
        wherein the protective layer is substantially planar, and
        wherein a thickness of the protective layer is between approximately 1 nm and 10 nm; and
    sealing of the cavity containing the thin layer getter material, such that at least a portion of the cavity remains after the sealing.

8. The encapsulation method according to claim 7, further comprising, between the treatment method of the thin layer getter material and the sealing step of the cavity, conducting a thermal treatment step of the thin layer getter material at a temperature approximately 50° C. to 150° C. less than an activation temperature of the thin layer getter material and under secondary vacuum at a pressure between $10^{-3}$ mbar and $10^{-7}$ mbar.

9. The encapsulation method according to claim 8, in which the thermal treatment step of the thin layer getter material carried out between the treatment method of the thin layer getter material and the sealing step of the cavity is executed over a period of between approximately few minutes and 50 minutes.

10. The encapsulation method according to claim 7, further comprising a thermal activation step of the thin layer getter material after execution of the treatment method of the thin layer getter material or, when the method comprises a thermal treatment step of the thin layer getter material conducted between the treatment method of the thin layer getter material and the sealing step of the cavity, after said thermal treatment step of the thin layer getter material.

11. The encapsulation method according to claim 10, in which the thermal activation step of the thin layer getter material is taken during the sealing step of the cavity.

12. The encapsulation method according to claim 10, in which thermal activation of the thin layer getter material is carried out by heating the thin layer getter material to a temperature between approximately 200° C. and 450° C.

13. The encapsulation method according to claim 7, in which a microelectronic and/or nanoelectronic device is also encapsulated in the cavity.

14. The method according to claim 1,
    wherein the thin layer getter material is titanium.

* * * * *